United States Patent [19]

Cohen et al.

[11] Patent Number: 4,737,446

[45] Date of Patent: Apr. 12, 1988

[54] METHOD FOR MAKING MULTILAYER CIRCUITS USING EMBEDDED CATALYST RECEPTORS

[75] Inventors: Abraham B. Cohen, Springfield; Roxy N. Fan, E. Brunswick; John A. Quinn, Morganville, all of N.J.

[73] Assignee: E. I. Du Pont de Nemours and Company, Wilmington, Del.

[21] Appl. No.: 947,832

[22] Filed: Dec. 30, 1986

[51] Int. Cl.⁴ .................... G03C 5/00; B05D 3/06; B05D 5/12

[52] U.S. Cl. .................... 430/311; 430/313; 430/315; 430/319; 427/43.1; 427/96; 427/98

[58] Field of Search ............... 430/311, 313, 315, 319, 430/43.1; 427/96, 98

[56] References Cited

U.S. PATENT DOCUMENTS

| | | | |
|---|---|---|---|
| 3,259,559 | 7/1966 | Schneble, Jr. et al. | 204/38 |
| 3,330,695 | 7/1967 | Curran | 117/212 |
| 3,391,455 | 7/1968 | Hirohata et al. | 29/625 |
| 3,506,482 | 4/1970 | Hirohata et al. | 117/212 |
| 3,546,011 | 12/1970 | Knorre et al. | 117/212 |
| 3,625,758 | 12/1971 | Stahl et al. | 117/212 |
| 3,822,128 | 7/1974 | Wainer et al. | 96/38.4 |
| 4,054,479 | 10/1977 | Peiffer | 156/280 |
| 4,054,483 | 10/1977 | Peiffer | 156/632 |
| 4,110,147 | 8/1978 | Grunwald et al. | 156/306 |
| 4,152,477 | 5/1979 | Haruta et al. | 428/209 |
| 4,229,518 | 10/1980 | Gray et al. | 430/273 |
| 4,287,253 | 9/1981 | Leech | 428/323 |
| 4,292,389 | 9/1981 | Kojima et al. | 430/169 |
| 4,454,168 | 6/1984 | Fritz | 427/96 |
| 4,478,883 | 10/1984 | Bupp et al. | 427/97 |
| 4,501,810 | 2/1985 | Fromson et al. | 430/302 |
| 4,567,062 | 1/1986 | Fan | 427/96 |

FOREIGN PATENT DOCUMENTS 55-48472 12/1980 Japan .

OTHER PUBLICATIONS

C. F. Coombs, Jr., ed., "Plating," *Printed Circuits Handbook*, 1979, Chp. 7.

J. A. Scarlett, *Printed Circuit Boards for Microelectronics*, 1980, Chp. 4.

J. A. Scarlett, ed., *The Multilayer Printed Circuit Board Handbook*, 1985, Chp. 12.

*Primary Examiner*—Nancy A. B. Swisher
*Assistant Examiner*—Patrick J. Ryan

[57] ABSTRACT

The invention is directed to a laminate for the preparation of a multilayer printed circuit by electroless plating of conductive metal thereon which comprises a. a substrate having formed on a surface thereof
b. a conductive pattern, and,
c. overlying the pattern and surrounding substrate areas, a layer of tonable photodielectric material having partially embedded therein finely divided particles of adsorbent which protrude from the layer surface away from the substrate, the protrusive surfaces of which are adsorptive with respect to electroless plating catalysts or reductive precursors thereof.

19 Claims, 1 Drawing Sheet

METHOD FOR MAKING MULTILAYER CIRCUITS USING EMBEDDED CATALYST RECEPTORS

FIELD OF THE INVENTION

This invention is directed to laminates having embedded catalyst receptors which make them suitable for metallization by electroless means and thereby particularly useful for the preparation of multilayer printed circuits.

BACKGROUND OF THE INVENTION

The preparation of printed circuit boards by electroless plating procedures is known, such as those disclosed in "Printed Circuits Handbook", Second Edition, edited by C. F. Coombs, Jr., published by McGraw-Hill Book Co., New York, NY, 1979, Chapter 7; in "Printed Circuit Boards for Microelectronics", Second Edition, by J. A. Scarlett, published by Electrochemical Publications, Ltd., Ayr, Scotland, 1980, Chapter 4 and in "The Multilayer Printed Circuit Board Handbook", edited by J. A. Scarlett, published by Electrochemical Publications, Ltd., Ayr, Scotland, 1985, Chapter 12.

Using electroless plating procedures, various techniques are known to enhance adhesion between substrate and plated metal and to define circuit lines, vias and pads.

Enhancing adhesion by plating onto surfaces roughened mechanically, chemically or by other means is common. In one method, disclosed in U.S. Pat. No. 4,110,147, microscopic pores are replicated in the surface of a thermoset plastic substrate by laminating it to microporous anodized aluminum. The aluminum is removed chemically prior to catalyzing and plating. The method is thus limited to thermoset substrates and requires the added expense and effort of anodizing, laminating and removing the aluminum foil.

In another method, disclosed in U.S. Pat. No. 3,330,695, hard, sharp edged, inert, inorganic dielectric powders, such as aluminum oxide or quartz, are embedded at elevated temperature into a polymeric layer and produce a rough surface from the many interstices present. There is no suggestion that particle microporosity is important or that the particles applied are capable of accepting electrolessly deposited metal; only vacuum sputtering or spraying molten metal is taught. Because of the high temperatures involved, applicability of the method to a wide variety of plastic substrates is uncertain.

A chemical method for roughening a plastic substrate to improve adhesion for electroless plating is the well known "swell and etch" technique. The substrate is treated with a solvent or solvent mixture that will swell, but not dissolve the material. In the swollen condition, the panel is chemically etched with oxidizing reagents such as hot chromic-sulfuric acid to create pits on the surface. The surface-roughened substrate is then screen printed or photoimaged with a resist by known procedures, sensitized and/or catalyzed and electrolessly plated. Alternatively, the resist can be applied after the catalyzing step. With this approach, the degree of plated metal adhesion can be limited depending on the effectiveness of the roughening step, which must be tailored to each different substrate material. The swell and etch technique uses solvents that are volatile and require special procedures and equipment for controlling fumes during application and drying. The hot oxidizing solution is corrosive and hazardous. Further, during the sensitization and catalysis steps, any resist used to define the circuit pattern can pick up catalyst on its surface which lead to unwanted extraneous plating, form nodules or even short circuits and will thus limit the circuit line resolution that can be reliably achieved. If, on the other hand, the entire substrate surface is catalyzed before applying the circuit-defining resist, then the resist must by stripped and the underlying catalytic agents thoroughly removed to prevent the possibility of electrical breakdown when high density circuits are made by this method.

Special cationic copolymers for promoting attachment of negatively charged catalyst species are recommended for treating substrates prior to catalysis in U.S. Pat. No. 4,478,883. While effective for the particular catalytic species specified, it is uncertain how many other catalytic types would be usable.

Another technique for surface roughening prior to circuit pattern formation is suggested in U.S. Pat. Nos. 3,625,758 and 3,546,011. The dielectric substrate contains uniformly dispersed materials, organic or inorganic, which are attacked by oxidizing or caustic reagents and preferentially etched out from the substrate to form the rough surface needed for plating. The U.S. Pat. No. 4,152,477, a butadiene-based rubber adhesive is etched away from hardened phenolic resin microcapsules dispersed in the rubber to provide increased surface area from the presence of the high number of small particles exposed. A characteristic of all these etch-out approaches is that the substrate or adhesive is limited to a narrow range of fillers or matrix materials, thus limiting applicability to a narrow range of substrates, or compromising other properties needed by high performance circuits.

In another approach, e.g., in U.S. Pat. Nos. 3,259,559 and 4,287,253, particulate materials suitable for catalyzing electroless deposition are uniformly dispersed in a polymeric matrix and molded into a dielectric substrate containing uniformly dispersed catalytic sites. Alternatively, such a mixture of polymer and catalyst can be applied as a separate adhesive layer to a dielectric substrate. A resist may be applied to define the circuit before plating. In this method, ionic or metallic species are left permanently on the substrate next to the plated circuit lines. This is unsatisfactory for high density circuits which need better and better dielectric materials for high speed microelectronic applications to prevent electrical breakdown. Also, unless very high catalyst loading is used, the available catalytic sites cover a relatively low fraction of the surface area. This leads to fewer bonding sites per unit area which restricts the adhesive strength obtained by the plated circuit.

In still another method, such as described in U.S. Pat. Nos. 3,391,455 and 3,506,482, the dielectric substrate is imagewise screen printed with an adhesive composition. The resulting adhesive circuit image is rendered catalytic by toning with copper powder. Because image formation is based on screen printing, plated line resolution is inherently low, the resulting circuits have unstraight sidewalls and are thus primarily suitable for lower quality uses or in applications that require only thin conductor layers.

Printed circuits can also be prepared by applying powdered material such as particulate metals onto surfaces having imagewise tacky and nontacky areas. Representative methods are disclosed in U.S. Pat. Nos. 4,054,479, 4,054,483 and 4,454,168. After the particulate metal is applied and unwanted particles are removed, the circuits are formed by one of several additive techniques including electroless plating. Without a separate resist to define circuit line sidewalls, the best applications for this approach are also thin copper layers or low density circuitry.

Methods for imaging without use of resists are known. U.S. Pat. No. 3,822,128 is directed to electroless plating of conductive metal onto a microporous anodized aluminum surface which has been made imagewise catalytic by photoforming metallic silver in the anodized layer. In Japanese Patent Application Publication No. 55-48,472, a conductive circuit is prepared on a dielectric substrate by applying titanium dioxide powder to an adhesive layer previously coated on the substrate, creating a latent image on the titanium dioxide layer by imagewise ultraviolet exposure to a circuit pattern, forming metallic silver plating catalyst on the exposed titanium dioxide particles by treatment with silver nitrate solution, electrolessly plating copper on the catalyzed areas and then curing the adhesive. These approaches suffer from the obvious restriction of being limited to specific materials, an anodized aluminum substrate or titanium dioxide layer. In addition, without the presence of a resist to contain plating, circuit applications would be primarily the lower quality, low definition applications.

In addition, U.S. Pat. No. 4,567,062 describes a process for preparing multilayer printed circuits comprising laminating to a substrate bearing a circuit pattern two photopolymerizable layers that differ in surface and bulk photoresponse; exposing the laminate to actinic radiation through a circuit image related to the circuit pattern on the substrate; embedding finely divided metal or plating catalyst on the tacky image areas; exposing the toned laminate through an image of at least one overlying segment of the conductive circuit pattern; removing unexposed photopolymer from the two layers to form vias; embedding finely divided metal or catalyst to the sidewalls of the vias and plating to form an interconnected conductive circuit. No teaching of embedding microporous particles receptive to catalytic agents is given in this reference, metals such as copper are preferred. The second exposure, whereby vias are formed through the toned circuit image, thus requires up to 10–20× the exposure time of the first imaging step. Resolution in the second and any subsequent circuit layers formed by the method of this patent is also limited due to light scattering by the embedded metal particles.

Photosensitive elements with particles embedded in their surfaces are known. In U.S. Pat. No. 4,229,518 there is disclosed an element with (1) a support, (2) at least one toned image-bearing photohardenable layer, (3) a photohardenable protective layer having on its surface finely divided particulate material such as diatomaceous silica. The toning of layer (2) can be carried out with electrically conductive materials. The powder on the surface gives the element a matte finish and renders it nontacky and suitable for handling. U.S. Pat. No. 4,292,389 describes a process where fine particles, to provide a matte surface and good vacuum drawdown, are fused to the surface of a photosensitive printing plate by spraying organic polymeric powders onto the heated plate surface then squeezing them into the photosensitive layer with nip rolls. The particles have a lower softening temperature than the photosensitive coating. U.S. Pat. No. 4,501,810 is directed to a diazosensitized lithographic printing plate having on its surface a developer permeable layer of discrete resin particles formed by coating the diazo layer with a resin emulsion, e.g., polystyrene, which is not film forming at room temperature. On exposure, the diazo layer becomes insoluble and adherent to the resin particles. On development, the particles remain on the surface in exposed areas. The plate is finally heat treated to coalesce the resin particles which strengthens and reinforces the image thereby giving longer press life. In these three patents, particles are present only to provide matte appearance or improve handling properties such as nontackiness, toughness or rapid vacuum drawdown. Nothing is disclosed regarding the importance of particle porosity, catalyst receptivity or suitability for electroless plating.

It is an object of this invention to provide a process for making multilayer printed circuit boards, using the electroless plating technique, that results in excellent adhesion and is readily adaptable to achieve high adhesion on a wide variety of substrates—organic, ceramic or metal. It is a particular object to provide a process that is suitable for developing good adhesion on high performance circuit board substrates such as those having low dielectric constant or other desirable properties such as strength, flexibility, or resistance to high temperatures, chemical or environmental attack. It is also an object to achieve high adhesion on such substrates but not require special additives or fillers in the substrate composition that could compromise electrical, physical, thermal or chemical resistance properties of the finished circuit.

It is another object of the invention to provide a process suitable for the highest multilayer circuit line and via definition, for example, circuit lines 0.001 to 0.002 inch (25.4 to 50.8 microns) wide, 0.001 to 0.002 inches (25.4 to 50.8 microns) high with straight sidewalls. These demanding requirements are important in high performance circuits to prevent impedance difficulties that might otherwise ensue.

It is still another object of this invention to provide a process that leaves no trace of metallic or ionic residues on the substrate to cause low resistivity between the conductor lines, thus making the process suitable for producing fine line, high performance multilayer circuitry not subject to electrical breakdown, particularly at high voltages or high temperature and humidity conditions.

Finally, it is an object of the invention to provide a method for making circuits that are ideal for use in producing multilayer circuit boards using existing lamination techniques because their smooth circuit surfaces require only thin adhesive layers between individual boards and minimum pressure in the lamination stage.

SUMMARY OF THE INVENTION

In its primary aspect, the invention is directed to a laminate which comprises
a. a substrate having formed on a surface thereof
b. a conductive pattern, and,
c. imagewise overlying portions of the pattern and surrounding substrate areas, a layer of tonable photodielectric material having partially embedded therein finely divided particles of absorbent which protrude from the layer surface away from the substrate, the protrusive surfaces of which are adsorptive with respect to electroless plating catalysts or reductive precursors thereof,
and to the use of such laminates for the preparation of multilayer printed circuits by electroless plating of conductive metal thereon.

In a secondary aspect, the invention is directed to a laminate which comprises
a. a substrate having formed on a surface thereof
b. a conductive pattern, and,
c. overlying the pattern and surrounding substrate areas, a layer of tonable photodielectric material having partially embedded therein finely divided particles of adsorbent which protrude from the layer surface away from the substrate, the protrusive surfaces of which have been rendered catalytic by adsorption thereon of an electroless plating catalyst,
and to the use of such laminates for the preparation of multilayer printed circuits by electroless plating of conductive metal thereon.

BRIEF DESCRIPTION OF THE DRAWING

The drawing consists of eight figures as follows.

DETAILED DESCRIPTION OF THE INVENTION

Figure 1:
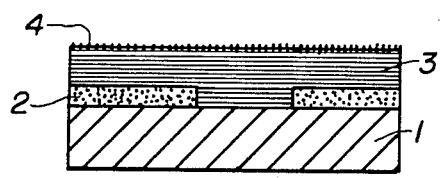
FIG. 1 shows a cross-sectional view of a dielectric substrate 1 with an electrical circuit 2. Overlying both is a tonable photodielectric layer 3 into which microporous receptor particles 4 are partially embedded. The particles protrude from the surface away from the support.

The method for making multilayer circuits of this invention begins with a circuitized substrate, i.e., a dielectric substrate (layer 1 in FIG. 1) having on its surface a conductive metal layer (layer 2 in FIG. 1).

The dielectric substrate 1 can be any one of the various kinds of synthetic resin sheets, plates, laminates, or composites, etc., having the necessary electrical and mechanical properties, chemical resistance, heat resistance, etc. The material may be rigid, flexible or moldable. Examples of resins include: phenol-formaldehyde, epoxy and melamine resins, high performance resins such as aramids or other polyimides, polyether-imides, fluorinated polymers, polysulfones, polyesters, polyether-ketones, etc. Glass plates and ceramic or ceramic coated metal plates are also useful. The substrate can also be paper, cardboard, fiber, including glass cloth, aramid fibers, wooden sheet material or paper-base phenolic resin laminate. Paper base without resin is particularly useful in producing low cost printed circuits. Metal sheets can be used provided that the material adhered thereto acts as an insulating barrier between the metal sheet support and the built up metallized circuit. Also useful are self-supported photohardenable elements as disclosed in Peiffer, U.S. Pat. No. 4,054,479.

The conductive metal layer, e.g., copper, which together with the dielectric substrate forms the circuitized substrate, can be a ground plane, a power plane, or signal layer. The latter can be a printed circuit pattern with closely spaced lines. The circuit pattern can be prepared by standard methods known in the art, e.g., etching of a copper layer on the surface of the dielectric substrate, or by other methods such as those described in Peiffer, U.S. Pat. No. 4,234,626 and Haney and Lott, U.S. Pat. No. 4,411,980, and the method using embedded catalyst receptors disclosed in copending application Ser. No. 947,833 filed concurrently herewith.

Before applying the tonable photodielectric layer 3, any required through holes in the circuitized substrate are made and the substrate is suitably cleaned or surface roughened as appropriate. Roughening creates bonding sites and can be achieved by mechanical abrasion with stiff brushes, abrasive pads, etc., or by other physical means such as sand or vapor blasting. Chemical methods for roughening the surface or providing bonding sites may also be used, such as chemical etching or application of adhesion promoters such as silanes.

To form vias and to provide a base for plating via pads and circuit lines in the second layer, a tonable photodielectric layer is applied to the circuitized substrate (FIG. 1, layer 3). In addition to being tonable at room or elevated temperature, useful compositions are those in which the exposed and developed layer has good adhesion, flexibility, electrical insulating properties and good resistance to heat, moisture, solvents, electroless plating baths and printed circuit soldering operations. The preferred tonable photodielectric compositions described in detail below in the specification are photopolymerizable compositions, i.e., compositions which harden in the exposed image areas. The invention, however, is not limited to the use of photopolymerizable compositions. Tonable photodielectric layers can be prepared from other photosensitive compositions, e.g., photocrosslinkable, photosolubilizable, photodesensitizable compositions, or combinations thereof, which are either positive-working or negative-working. These systems are disclosed generally in Kosar, Light Sensitive Systems, Chapters 4 to 6, Wiley and Sons, New York, 1965. Other useful photosensitive compositions can be exemplified as follows: photocrosslinkable compositions of Celeste U.S. Pat. No. 3,526,504, photosolubilizable compositions of Roos U.S. Pat. Nos.

3,778,270 and 3,837,860, and photodesensitizable compositions of Nebe U.S. Pat. No. 4,029,505 and Pazos U.S. Pat. No. 4,198,242. Photopolymerizable tonable photodielectric compositions contain the normal ingredients of photopolymerizable materials, i.e., polymeric binder, ethylenically unsaturated compound and photoinitiator or photoinitiator system. Other materials can also be present such as oligomers, plasticizers, fillers, colorants, ultraviolet absorbers or optical brighteners. The binder can be a polymer, copolymer or polymer mixture, for example, a copolymer of methyl methacrylate, butadiene and styrene. Other examples are epoxy resins, acrylic copolymers such as from acrylonitrile, butyl acrylate and methacrylic acid monomers. Suitable binders include, but are not limited to, those described in Gervay and Pilette U.S. Pat. No. 4,278,752, column 5, lines 4 through 40. Suitable monomers are those disclosed in Fickes and Rakoczy U.S. Pat. No. 4,400,460, column 3, line 48 to column 5, line 4, and Haney and Lott U.S. Pat. No. 4,411,900, column 4, lines 10 to 65. The photoinitiator or photoinitiator system includes any of those compounds disclosed in Notley U.S. Pat. No. 2,951,752, Chambers U.S. Pat. No. 3,479,185, Chang and Fan U.S. Pat. No. 3,549,367, Fan U.S. Pat. No. 3,558,322, Cescon U.S. Pat. No. 3,615,454, Grubb U.S. Pat. No. 3,647,467, Baum and Henry U.S. Pat. No. 3,652,275, Chang U.S. Pat. No. 3,661,558, Strilko U.S. Pat. No. 3,697,280, Chang U.S. Pat. No. 3,926,643, Dessauer U.S. Pat. No. 4,311,783, Sysak U.S. Pat. No. 4,341,860, etc.

The tonable photodielectric layer can be applied as a liquid, e.g., solution, suspension, etc., by conventional means, e.g., dip coating, spin coating, coating with a doctor knife, spraying, etc. The layer can be 0.0001 inch to 0.010 inch (2.54 to 254 microns) thick, preferably 0.0005 to 0.004 inch (12.7 to 101.6 microns) thick. For thicknesses above 0.001 inch (25.4 microns), the tonable photodielectric layer is preferably applied in the form of a dry film by using lamination procedures well known in the art.

Referring to FIG. 1, the microporous receptor particles 4 applied to the tonable photodielectric layer are finely divided, high porosity substances having a high surface area. They can be mineral particles such as gamma-aluminum oxide, Boehmite alumina, silica and magnesium oxide.

As with all catalyst supports it is essential that the adsorbent surface of the catalytic receptors allows access of the catalytic material and that it is both chemically and physically stable under the conditions of use. While the receptors must be adsorptive with respect to electroless plating catalysts or their reductive precursors, it is preferred that they be nonadsorptive with respect to any materials contained in any overlying photodielectric layers. Provided that the catalyst receptors meet these basic criteria, the exact chemical composition is not so important in its use for the invention so long as it does not interfere with the catalytic function. Therefore solid particles, which may be either inorganic or organic in nature, are useful which have a surface area of at least 75 $m^2/gm$ and a pore volume of at least 0.1 $cm^3/gm$. A surface area of at least 200 $m^2/gm$ and pore volume of at least 0.5 $cm^3/gm$ are preferred.

In view of the inverse relationship between surface area and pore diameter of such adsorbents, it is preferred that the surface area of the receptors be no more than 500 $m^2/gm$ and preferably no more than 400 $m^2/gm$. Finely divided particles of Boehmite alumina are particularly preferred for use as catalyst adsorbents in the invention. Receptor particle size can be 0.5 to 50 microns, preferably 1 to 10 microns. Surface area can be 150 $m^2/gm$ or higher, preferably above 250 $m^2/gm$.

The finely divided receptor particles are applied to the photodielectric material and become only partially embedded therein. It is important that the receptor particles protrude from the surface away from the substrate as their uncovered surfaces provide sites for receiving deposits of catalyst or catalyst precursor to initiate electroless plating.

The particles may be applied by known methods including but not limited to the toning methods described in Burg and Cohen U.S. Pat. No. 3,060,024, Chu and Cohen U.S. Pat. No. 3,649,268, and Tobias U.S. Pat. No. 4,069,791. It is also possible to use a fluidized bed of particles as described in Research Disclosure, June 1977, No. 15882 by Peiffer and Woodruff. Optionally, the acceptance of the particles by the surface may be improved by tackifying the tonable photodielectric layer, e.g., by heat from an infrared heater or by treatment with a plasticizing solvent. This may be accomplished during the application of the particles. Removal of excess receptor particles from nonadherent areas, if necessary, is described in the above-identified U.S. patents and the Research Disclosure. As used herein, the term "toning" generally refers to applying receptor particles to the tonable photodielectric so they become only partially embedded and protrude from the surface.

The tonable photodielectric layer is next imaged by exposure to actinic radiation through a positive mask of the desired via pattern. Sources providing actinic radiation for imagewise exposure are known to those skilled in the art and are rich in ultraviolet radiation. Suitable sources are disclosed in Plambeck, U.S. Pat. No. 2,760,863, Chu and Cohen, U.S. Pat. No.3,649,268, Peiffer, U.S. Pat. No. 4,157,407, and Haney and Lott U.S. Pat. No. 4,411,980.

The resulting exposed element is optionally nonimagewise exposed to infrared radiation before development. This heating step enhances the degree of polymerization, improves contrast and resolution, allows shorter image exposure time and produces straighter sidewalls in the developed image.

Figure 2:
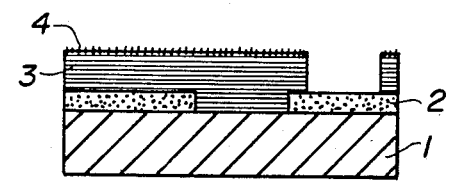
FIG. 2 shows a cross-sectional view wherein the photodielectric layer 3 has been exposed imagewise to a via pattern and developed. The via has been opened to the electrical circuit 2 and the remaining photodielectric 3 has been photohardened thereby anchoring the receptor particles 4.

The soluble portions of the tonable photodielectric layer and receptor particles thereon are removed by solvent washout (FIG. 2). In the remaining areas, the receptor particles 4 remain and retain open micropores. Typical development solvents include: 1,1,1-trichloroethane, perchloroethylene, perchloroethylene and n-butanol, 1,1,1-trichloroethane and n-butanol, butyl and ethyl Cellosolve®, butyl Carbitol® and 1,1,1-trichloroethane and derivatives thereof, various alcohols, e.g., methanol, ethanol, propanol, isopropanol, etc. and 1,1,1-trichloroethane, etc. These and other useful solvents, e.g., aqueous and semi-aqueous developers are described in the patents which disclose the particular photosensitive compositions.

At this stage, sidewalls of the remaining tonable photodielectric layer may be toned, if desired, by applying catalyst receptor particles and then baking the element while leaving excess particles on the surface and filling the developed-out channels. The excess particles are removed in the usual way after cooling the baked element.

After development, the tonable photodielectric layer is further hardened or cured by photocuring and/or thermal curing or by chemical treatment. In the embedded portion of the particle, material can enter the pores. Hardening the layer thus serves to lock the particle in the layer as well as increasing the layer's cohesive strength. Both factors enhance bonding of the subsequently plated metal. Curing also improves adhesion between the tonable photodielectric and the circuitized substrate. Optimum curing conditions depend on substrate and tonable photodielectric compositions used and may also be influenced by conditions of the final oven baking step after electroless plating. Suitable sources rich in ultraviolet radiation for photocuring are known to those skilled in the art and are listed above in the section on exposure of the tonable photodielectric layer. Other actinic radiation sources include and Argus Model PC-7100 ultraviolet processor or a Tamarack ® 152R, a 1000 watt collimated mercury arc. Thermal curing of the layer can be achieved by heating, e.g., in a temperature-controlled oven or by infrared radiation.

Figure 6:
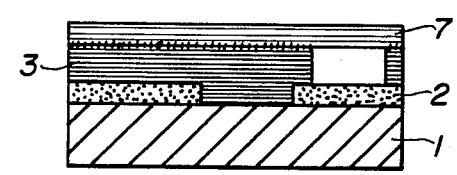
FIG. 6 is a cross-sectional view of a photodielectric layer 7 bridging the via and overlying the tonable photodielectric 3 and the microporous receptor particles 4.

As shown in FIG. 6, a photodielectric layer 7, to be used for defining circuit lines and pad areas, is next applied to the toned surfaces. Liquid application by conventional means can be used, e.g., solution, suspension, etc. by dip coating, spin coating, curtain coating, coating with a doctor knife, spraying, etc. The photodielectric layer may be 0.0001 inch to 0.004 inch (2.54 to 101.6 microns) thick, preferably 0.001 to 0.002 inch (25.4 to 50.8 microns) thick. For thicknesses in the 0.001 to 0.004 inch (5.4 to 101.6) microns range, the photodielectric is preferably applied in the form of a dry film using lamination procedures well known in the art; the layer then bridges or tents over the developed-out vias, as shown in FIG. 6.

The preferred composition described in detail below is a photopolymerizable composition, i.e., a composition which hardens in the exposed image areas. The invention, however, is not limited to the use of photopolymerizable compositions. Like the tonable photodielectric compositions referred to earlier, they can be other photosensitive compositions, e.g., photocrosslinkable, photosolubilizable, or photodesensitizable compositions, or combinations thereof, which are either positive-working or negative-working. The primary difference with these photodielectric compositions is that they are not required to be tonable. Photopolymerizable photodielectrics contain the normal ingredients of photopolymerizable materials, i.e., polymeric binder or mixture of polymers as binder, ethylenically unsaturated compound and photoinitiator or photoinitiator system. Other materials can also be present such as oligomers, plasticizers, fillers, colorants, ultraviolet absorbers, optical brighteners, etc. Suitable examples of useful binders, monomers and photoinitiator systems are those described above for the tonable photodielectric layer composition.

Preferred compositions are those in which the exposed and developed photodielectric has good adhesion, flexibility, electrical insulating properties and good resistance to heat, moisture, solvents, electroless plating baths and printed circuit soldering operations. In addition, they should not retain electroless plating catalysts or precursors thereof in order to prevent extraneous plating. In large part, these properties are attributable to the binder.

The photodielectric layer is imaged to form via pads and circuit lines by exposure to actinic radiation through a mask of the desired pattern in register with the existing vias. The sources providing actinic radiation for imagewise exposure are known to those skilled in the art and are rich in ultraviolet radiation. Suitable sources are listed above in the section describing exposure of the tonable photodielectric layer.

The resulting element is optionally nonimagewise exposed to infrared radiation before development. This heating step enhances the degree of polymerization, improves contrast and resolution, allows shorter image exposure time and produces straighter sidewalls.

The soluble portions of photodielectric are removed by solvent washout (FIG. 7) by the methods described above for development of the tonable photodielectric layer. The receptor particles 4 remain in the developed-out areas and retain open micropores.

An optional thermal cure may now be carried out. This improves adhesion between the photodielectric and the adjacent toned layer and further crosslinks the remaining photodielectric layer. Optimum conditions depend on substrate and tonable photodielectric compositions used and may also be influenced by conditions of the final oven baking step after electroless plating.

The resulting element is prepared for electroless plating by known methods. This may be by a one-step or a two-step process. In the preferred two-step methods, the element is first treated with a sensitizer, or catalyst precursor, in order to introduce a reducing agent, such as stannous chloride, into the pores of the receptor particles 4. It is desirable to rinse thoroughly after sensitizing. Good rinsing removes excess sensitizer from the adjacent photodielectric and from the particle surface between pores. The desired reductant is thereby preferentially localized inside the micropores. Extraneous plating is thus minimized and adhesion of electrolessly plated metal is maximized by the interlocking of the metal with the receptor particles. Stannous chloride is the preferred sensitizer, but others known in the art would be suitable, such as cuprous chloride, as in Steffen U.S. Pat. No. 4,020,197, and trivalent arsenic compounds as in Bernhart U.S. Pat. No. 3,764,488. In addition to the inorganic agents described, organic reducing agents such as hydrazine can be used.

The second step consists of treating the sensitized element with a solution of a salt of a metal catalytic for electroless plating, such as palladium chloride. Catalytic metal particles, such as palladium, are thereby deposited within the pores. Palladium, platinum, gold, silver or copper can be deposited on the receptor particles as catalysts. In the two step process salts of these metals are reduced by stannous chloride or other sensitizer in the micropores when the sensitized element is immersed in a bath containing a metal salt, such as a palladium or platinum chloride/hydrochloric acid bath, an ammoniacal silver nitrate bath, or a copper halide solution as in Nuzzi et al. U.S. Pat. No. 4,450,190.

In an alternative one-step process, a suspension of colloidal metal particles, such as copper or palladium having a protective colloid of stannic tin, is used directly after resist washout to catalyze the receptor particles. Useful compositions are commercially available, e.g., from Shipley Co., Revere, MA or Lea Ronal. Further details on the processes of sensitizing and catalyzing partially embedded microporous receptor particles to make them receptive to electroless plating are given in copending application Ser. No. 947,833 filed concurrently herewith.

The catalyzed element is electrolessly plated by methods well known in the art. The plated metal 5 in FIGS. 3, 4, 5, and 8 may be copper, nickel, gold, silver, cobalt, or any metal known in the art to be capable of electroless deposition. Copper is preferred. Electroless plating baths and procedures are known to those skilled in the art, e.g., U.S. Pat. No. 4,054,483. Electroless plating baths are commercially available, e.g., from the Shipley Co., Revere, MA, Kollmorgen Corp., Glen Cove, NY, Lea Ronal, Freeport, NY, and other sources. Useful electroless plating solutions are described in Zeblisky et al., U.S. Pat. No. 3,095,309, particularly Example II. The catalyzed element to be plated is maintained in the bath under conditions described below whereby the uncovered areas of the catalyzed, partially embedded receptor particles forming the circuit image are plated over to form an electrically conductive circuit.

It is preferred to carry out the electroless plating in two stages, wherein the first stage uses an active bath for a short time, followed by a longer plating time in a more stable, less active bath. The initial flash plating or priming is carried out long enough to plate a thickness of 0.5 micron to 1.0 micron to assure complete coverage of deposited metal in all circuit areas, including vias. The element being plated can be removed from the bath for visual inspection and replaced to continue plating if necessary. The first bath has higher activity, which may be achieved by operating at temperatures of 5 to 15 F. above the usual bath operating temperature. Other ways of increasing plating activity are by reducing the concentration of the stabilizer or complexing agent in the bath. For a commercial copper plating composition that typically operates at 127 F., the operating conditions for the priming bath would be at 132 to 142 F. for a time of 2 to 15 min.

The second stage in plating uses a bath for a longer time, as long as needed to get the plating thickness required. The second bath has lower activity, thus is more stable and is less subject to nodules, extraneous copper deposition and other plating defects. Lower activity can be achieved by operating at temperatures of 5 to 15 F. below the normal bath operating temperature. Other ways of decreasing bath activity are by increasing stabilizer or complexing agent concentration. For a commercial copper electroless plating bath that typically operates at 127 F., operating conditions in the second bath would be 112 to 122 F. for 4 to 16 hours to achieve a final plating thickness of 0.0005 inch to 0.002 inch (12.7 to 50.8 microns).

Figure 8:
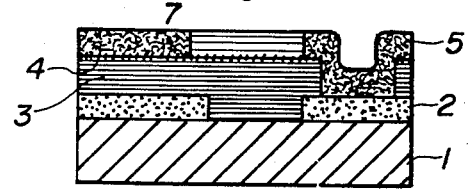
FIG. 8 shows a cross-sectional view of a multilayer circuit having electrolessly deposited metal 5 in a circuit pattern connected in the via to the original circuit 2 and otherwise separated from it by the photohardened tonable dielectric layer 3.

Referring to FIG. 8, the metal deposit 5 may be plated up to the full height of the photodielectric 7 electrolessly or electrolytically, with the same or different metal or alloy used in the initial bath. When plating has reached the top of the resist sidewalls, plating is stopped. The element is rinsed and may be treated with benzotriazole solution to prevent copper oxidation on further storage and handling. A final oven baking step removes residual volatile materials and anneals plated copper, improving its physical properties. Optimum baking conditions depend on adhesive composition and the degree to which the element was cured before plating, as outlined in copending application Ser. No. 947,833 filed concurrently herewith.

A third signal layer with vias can be applied by cleaning and lightly surface roughening a two-layer circuit prepared as described above then repeating the process of applying a tonable photodielectric layer, toning, imaging to form vias, defining circuit lines and pads with a photodielectric layer, catalyzing and plating.

The entire process can be repeated to achieve as many layers as needed in the multilayer circuit.

Figure 3:
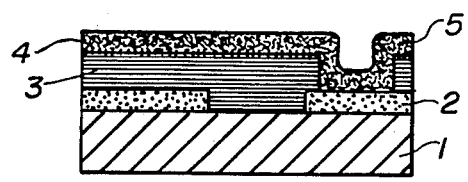
FIG. 3 is a cross-sectional view showing electrolessly deposited metal 5 overlying and adhered to the exposed and developed tonable photodielectric layer 3 by means of receptor particles 4. In the via, the metal 5 is in conductive contact with electrical circuit 2.
Figure 5:
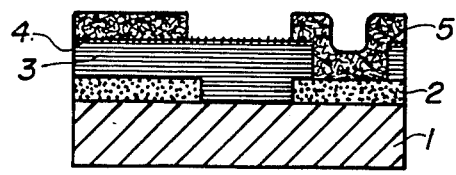
FIG. 5 shows a cross-sectional view of a completed multilayer circuit. The upper circuit of electrolessly deposited metal 5 is connected at the via to the lower circuit 2 and otherwise separated from it by the photohardened tonable dielectric layer 3.

In an alternative method for making a multilayer circuit, one can start with the element depicted by FIG. 2, i.e., a circuitized substrate with a toned and imaged layer. The exposed portions of the partially embedded microporous receptor particles 4 are catalyzed and electrolessly plated by methods previously described to give an element as shown in FIG. 3. Electrolessly plated metal is deposited on the surface of the tonable photodielectric layer, on the metal exposed on the circuitized substrate and on the via sidewalls. After the electroless plating is conductive, the required plating thickness may be achieved either electrolessly or electrolytically. To form the via pads and circuit lines, a conventional resist 6 is applied. The resist can be screen printed, or photoprinted using a liquid or a dry film photoresist. The exposed metal layer obtained by use of the resist is etched away by conventional means resulting in the two layer circuit with via as shown in FIG. 5.

Figure 4:
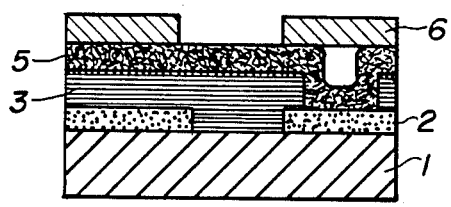
FIG. 4 shows a cross-sectional view with photoresist 6, imagewise exposed and developed in a circuit pattern, overlying the electrolessly deposited metal 5.

In yet another method for making a multilayer circuit using a conventional resist 6 applied as shown in FIG. 4, the exposed metal layer obtained by use of the resist is plated with the same or a different metal, the resist is stripped and the metal uncovered by stripping the resist is removed by etching.

A still further method for preparing multilayer printed circuits starts with a laminate corresponding FIG. 1 but where the protrusive surfaces of the particles 4 have an electroless plating catalyst adsorbed thereon. Such a laminate can be used to prepare multilayer printed circuits by any of the methods described above with the sole exception that a separate step or steps to catalyze the particles is not necessary.

EXAMPLES

Example 1

This example illustrates preparation of a multilayer circuit with vias wherein the top layer via pads and circuitry were defined by etching away a copper layer produced by the method of this invention.

A. Circuitized Substrate

A ceramic substrate with a copper ground plane was used. It was prepared by screen printing copper/glass paste onto a 0.040 inch (1.02 mm) alumina panel and firing, by procedures known in the art. Optionally it could be prepared or by applying a curable adhesive composition to the alumina panel, toning with microporous receptor particles, photoimaging, catalyzing and electrolessly plating as described in copending application Ser. No. 947,833 filed concurrently herewith.

B. Defining Vias

A tonable photodielectric was made as a dry film by machine coating the composition below at 30% solids from methylene chloride at a dry thickness of 0.0023 inch (58.4 microns) onto 0.001 inch (25.4 microns) silicone release treated polyethylene terephthalate film; identical polyester film, except with a higher release treatment, was used as a temporary interleaf.

| Ingredient | Amount (Parts) |
| --- | --- |
| Di-(3-acryloxy-2-hydroxypropyl) ether of bisphenol-A | 43.9 |
| Trimethylolpropane triacrylate | 3.4 |
| Michler's ketone | 0.2 |
| Monastral ® Green pigment (30%) roll mill blended with methyl | 0.1 |

-continued

| Ingredient | Amount (Parts) |
| --- | --- |
| methacrylate (34)/styrene (42)/acrylonitrile (8)/butadiene (16) interpolymer | |
| Methyl methacrylate/butadiene/styrene copolymer[1] | 13.1 |
| Methyl methacrylate/ethyl acrylate copolymer 96/4[2] | 2.6 |
| 4-Chlorobenzophenone | 3.9 |
| Hardwick 71R clay[3] | 26.2 |
| Synthetic rubber [3% carboxy-modified acrylonitrile(27)/butadiene(73) copolymer][4] | 6.6 |

[1] Acryloid ® KM-BTA-III F (Rohm and Haas, Philadelphia, PA).
[2] Elvacite ® 2021 NL, i.v. 0.54 (E. I. du Pont de Nemours and Company, Inc., Wilmington, DE).
[3] High brightness clay having a chemical composition: $SiO_2$ (45.5%), $Al_2O_3$ (38.3%), $Fe_2O_3$ (0.3%), $TiO_2$ (1.5%), CaO (0.1%), $Na_2O$ (0.1%), $K_2O$ (trace), specific gravity of 2.58, average particle size 0.55 micron, oil absorption (ASTM D281-31), of 37 to 41, refractive index 1.56, pH 6.5 to 7.5 (Hardwick Chemical Corp., Akron, Ohio).
[4] Hycar ® 1472X26 (B. F. Goodrich, Cleveland, OH).

The tonable photodielectric film was laminated to the circuitized substrate with a Riston ® HRL-24 hot roll laminator (E. I. du Pont de Nemours and Company, Wilmington, DE), operating at 103 C.

After removing the remaining polyester film, the surface of the laminated panel was toned with powdered activated Boehmite alumina, (Monal ®300, median particle size 8.7 microns, surface area 300 m²/g, Aluminum Co. of America, Pittsburgh, PA) by the following procedure:

The particles are applied by lightly swabbing, or toning, the adhesive surface with a mohair pad previously loaded with particles by dipping the pad into a supply of powder. The toning was carried out in vertical parallel strokes across the entire panel, then was followed by complete coverage with parallel horizontal strokes (one toning cycle). Four toning cycles completed the application procedure.

The toned panel was let stand 5 minutes at room temperature then wiped with a lint free, oil treated flannel cloth, (LAS-STIK ® cloth, LAS-STIK ® Manufacturing Co., Hamilton, OH). This removed excess loose alumina particles.

The toned element was exposed 8 seconds under vacuum, drawdown time 30–60 seconds, through via pattern positive artwork in a 5 KW mercury vapor Riston ® PC-24 Printer (E. I. du Pont de Nemours and Company, Wilmington, DE).

The exposed panel was developed with methyl chloroform in a Riston ® C-Processor, (E. I. du Pont de Nemours and Company, Wilmington, DE). Conveyor speed was adjusted so residence time in the solvent chambers totaled 38 seconds, only pumps #2 and #3 were used. Unexposed, toned photodielectric was completely removed to form vias, but the partially embedded receptor particles remained in the exposed areas. Image quality was good.

The toned photodielectric layer was cured by first passing through a Model PC-7100 ultraviolet processor (Argus International, Hopewell, NJ) at a transport speed of 40 ft/min. (20.3 cm/sec), then heating for one hour in a 150 C. oven.

The developed panel was cleaned by swabbing with mild detergent solution and rinsing in tap water, followed by distilled water. The panel was then immersed two minutes in 0.6% $SnCl_2$ solution at room temperature. This solution was prepared by dissolving 36 g of $SnCl_2$ in 36 g of concentrated HCl, then diluting to 6000 g with distilled water. After treatment, the sample was rinsed in tap water one minute, then distilled water for 30 seconds. To remove extraneous and loosely held stannous chloride, the panels were twice dipped in 1N HCl for 30 seconds. Stannous chloride residues were thus preferentially left inside the micropores of the partially embedded receptor particles.

The sensitized panel was treated for two minutes in acidic 0.025% $PdCl_2$ solution prepared by diluting acidic 5% $PdCl_2$ 200-fold with distilled water. In this step, palladium chloride was thereby reduced to metallic palladium in areas where stannous chloride was present, preferentially inside receptor micropores. The resulting catalyzed panel was rinsed in tap water one minute and distilled water one minute.

Two step electroless plating, in which an active bath was used for a short time to produce a thin flash plating or priming layer of copper, followed by longer immersion in a lower activity bath, was used and was preferred. This enhanced plating selectivity and led improved quality.

As a priming bath, commercial composition AP 480 (Kollmorgen Corp., PCK Technology Div., Melville, NY) was used. This was a high pH, complexed copper salt, formaldehyde reductant composition. Operational temperature was 57 C. (+/−1 C.) with an immersion time of 3–10 minutes, selected so that uniform plating was visible on the toned surface and in all the photoformed vias. The plated panel was then rinsed in tap water one minute and in distilled water 30 seconds.

To complete plating, the flash-plated article was held in a bath of identical compostion, but of lower activity, for about eight hours or as needed to achieve 0.001 inch (25.4 microns) of plated copper. Bath activity was reduced by operating at temperature of 48 C. (+/−1 C.). Plating quality was thereby improved and better controlled.

After rinsing as above, the part was treated with aqueous acidic benzotriazole solution to prevent copper oxidation during further storage and handling. A final treatment of the plated panel in a 150 C. oven for one hour removed residual volatiles and improved adhesion of the plated copper to the dielectric layer.

C. Defining Via Pads and Circuitry

A 0.002 inch (50.8 mm) thick dry film photoresist (Riston ® 1220, E. I. du Pont de Nemours and Company, Wilmington, DE), was laminated to the electrolessly plated element and photoimaged by the method described above, except for using a 15 second exposure time, negative circuit pattern art work and 28 second residence time in the solvent chamber, using all three pumps during development.

Copper in the open areas on the panel was removed by etching in 5% ammonium persulfate at room temperature. Photohardened resist overlying the remaining copper circuit was stripped by immersing the panel in methylene chloride with stirring, followed by rinsing and air drying.

Example 2

This example illustrates preparation of a multilayer circuit with vias wherein the top layer via pads and circuitry were defined by the additive plating method of this invention.

A. Circuitized Substrate

A ceramic substrate with a copper ground plane was used as in Example 1.

B. Defining Vias

The method of Example 1 was used. An element corresponding to FIG. 2 was obtained.

C. Defining Via Pads and Circuitry

A dry film photodielectric element was prepared by machine coating the composition below at a thickness of 0.001 inch (25.4 microns) onto 0.0005 inch (12.7 microns) polyethylene terephthalate film; 0.001 inch (25.4 microns) polyethylene was used as a temporary interleaf. The film was laminated to the via-containing element as described in Example 1C.

| Ingredient | Amount (Parts) |
|---|---|
| Di-(3-acryloxy-2-hydroxypropyl) ether of bisphenol-A | 240.0 |
| Trimethylolpropane triacrylate | 240.0 |
| Methylene chloride | 3000.0 |
| o-Chloro HABI | 30.0 |
| Michler's ketone | 1.0 |
| TLA-454 | 3.2 |
| Cyan pigmented polymer[1] | 3.0 |
| Yellow pigmented polymer[2] | 3.0 |
| High molecular weight poly-(methyl methacrylate)[3] | 200.0 |
| Copolymer binder[4] | 282.2 |

[1]Monastral ® Blue G (BT 284D), CI No. Pigment Blue 15 (40%) dispersed in Elvacite ® 2051 (50%) with 10% Elveron ® AB Dispersant (E. I. du Pont de Nemours and Company, Wilmington, DE).
[2]Chromophthal ® Yellow 3G, CI No. Pigment Yellow 93 (40%), dispersed in Elvacite ® 2051 (50%), with Elveron ® AB Dispersant (10%).
[3]Elvacite ® 2051 (E. I. du Pont de Nemours and Company, Wilmington, DE).
[4]Acryloid ® BTA-III-S (Rohm and Haas Co., Philadelphia, PA.)

The laminated element obtained (corresponds to FIG. 6) was exposed 10 seconds through positive via pad and circuit line artwork as described in Example 1. After exposure, in order to enhance image quality, the panel was heated by being conveyed beneath two infrared lamps. Conveyor speed was 37 cm/minute, lamp to panel distance was one inch (25.4 microns). Surface temperature of the panels reached 110 C. as measured by Tempilabels ® (Tempil Div. of Big Three Industries, Inc., South Plainfield, NJ). During this treatment, the polyester cover sheet on the photodielectric layer was left in place.

Figure 7:
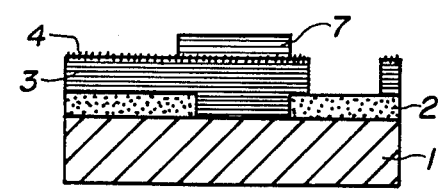
FIG. 7 shows a cross-sectional view of imagewise exposed and developed photodielectric 7 bound to the tonable photodielectric layer 3 by means of the receptor particles 4. The via and some receptor particles have been uncovered.

Next, the image was developed with methyl chloroform as in Example 1, using 24 second solvent chamber residence time. Unexposed photodielectric was removed and the via and embedded receptor particles were revealed in the open areas as shown in FIG. 7.

The developed panel was sensitized and catalyzed by the two step procedure described in Example 1B to deposit palladium catalyst in the receptor particles.

The catalyzed panel was electrolessly plated by the two step method described in Example 1B. A multilayer circuit corresponding to FIG. 8, with good conductivity throughout, was obtained.

EXAMPLE 3

This example illustrates formation of a three layer circuit on glass epoxy support with photoformed vias by a fully additive process with appropriate interconnections between the different layers.

A. Circuitized Substrate

The dielectric substrate used was standard glass-epoxy, to which a curable adhesive layer was applied. The adhesive used was a 22% solids aqueous dispersion of an acrylic copolymer (acrylonitrile 35/butyl acrylate 60/methacrylic acid 5) plus a phenol formaldehyde resin (Grade BRL 100, Union Carbide, Danbury, CT). The substrate was coated with adhesive by inserting the panel vertically into the solution at room temperature, holding for 10 seconds, withdrawing rapidly, and air drying 30 minutes. Remaining volatiles were removed by drying 5 minutes in a 100 C. oven. The resulting adhesive layers each had a coating weight of 30–35 mg/dm² corresponding to a thickness of about 0.0001 inch (2.54 microns). The coating was not tacky at room temperature.

Microporous receptor particles (Monal ® 300) were applied to the adhesive by a hot toning process. The smooth flat surface of a hot plate was brought to 133–155 C. Activated alumina, Monal ® 300, was spread uniformly on the hot surface. The adhesive coated element was placed on the hot powder layer for 10 seconds, then toned with a mohair pad carrying more alumina, as in Example 1B, for 40 seconds. A uniform distribution of particles was achieved. The toned panel was allowed to cool to room temperature and excess particles were wiped off with an oil-treated cloth as in Example 1B. The toned adhesive layer was cured by heating the panel in a 150 C. oven for one hour. Two step catalysis and electroless plating was carried out to produce a uniform 0.001 inch (25.4 microns) layer of copper on the surface.

B. Defining Vias

The plated panel was laminated with a layer of the tonable photodielectric film described in Example 1B. It was toned, exposed, developed and cured as in Example 1B.

C. Defining Via Pads and Circuitry

The photodielectric film of Example 2B was laminated, as described therein, to the toned panel. It was then exposed as before with positive artwork containing circuit lines and pad areas in register with the vias. Exposure time was 9 seconds. Infrared radiation post exposure was carried out, followed by methyl chloroform development, as in Example 2B.

The resulting element had a via pad/circuit pattern in the form of partially embedded receptor particles with the image being defined by the photodielectric layer.

The exposed microporous receptor particles were catalyzed in the two step process given in Example 2C. Electroless plating and a post-plating oven bake were carried out as in Example 1B. A fully conductive two layer circuit was obtained.

Vias for a third layer were formed in the same way as above—by laminating, toning, exposing and developing another layer of tonable photodielectric film. To enhance adhesion to plated copper, the two layer circuit panel was lightly scrubbed, before lamination, with a Somaca ® scrubber model SBC-12F (Sommer and Maca, Chicago, IL) which conveyed the panel between scrubbing brushes, spray rinses and air blast drying sections.

The scrubbed circuit was air dried at room temperature, then heated five minutes in a 150 C. oven to remove any remaining volatiles.

Circuit lines and pad areas in register with the vias were created by laminating, exposing and developing a second photodielectric film, then catalyzing and plating the resulting open toned areas as described above.

The final three layer circuit produced had good image quality and full conductivity between all three layers in the desired areas.

Example 4

A. Circuitized Substrate

A copper-clad FR-4 glass/epoxy panel was used as a ground plane. It was machine scrubbed in preparation for lamination as in Example 3C.

B. Defining Vias

The tonable photodielectric composition of Example 1B was laminated, toned with Monal ® 300 alumina powder, exposed for 5.5 seconds to a target having a pattern of 0.012 inch (305 microns) vias and developed (50 seconds total time in processor) as in Example 1B. An element corresponding to FIG. 2 was obtained. To apply receptor particles to the via sidewalls, the element was toned again with Monal ® 300, baked one hour at 65 C. with excess particles left on the surface and filling the developed-out channels. After cooling to room temperature, the excess alumina particles were removed with an oil treated cloth as in Example 1B.

C. Defining Via Pads and Circuitry

The photodielectric layer of Example 2C was laminated, exposed ten seconds in register to a circuit line and via pad image, infrared treated, developed and catalyzed with palladium as in Example 2C. An element corresponding to FIG. 7 was obtained. After a rinse and mild acid dip to remove any oxide from the copper ground plane, two step electroless plating, as in Example 1C, was carried out. The resulting plated panel was treated with a dilute aqueous solution of benzotriazole and hydrochloric acid composition to prevent copper oxidation and baked one hour at 65 C. An element corresponding to FIG. 8 was obtained. The vias were all plated and conductive.

After lightly machine scrubbing the resulting two layer circuit panel, the sequence of steps above was repeated to produce a three layer circuit with a second signal layer having 0.008 inch (203 microns) vias in register with the first signal layer, and with 0.012 inch (305 microns) plated through holes to the ground plane.

We claim:

1. A laminate for the preparation of a multilayer printed circuit by electroless plating of conductive metal thereon which comprises
   (1) a substrate having formed on a surface thereof
   (2) a conductive pattern, and,
   (3) overlying the pattern and surrounding substrate areas, a layer of tonable photodielectric material having partially embedded therein finely divided particles of adsorbent which protrude from the layer surface away from the substrate, the protrusive surfaces of which are adsorptive with respect to electroless plating catalysts or reductive precursors thereof.

2. The laminate of claim 1 wherein the conductive pattern is a ground or power plane.

3. A method for making a laminate for the preparation of multilayer printed circuits by electroless plating of conductive metal thereon which comprises the sequential steps of
   (1) forming a conductive pattern on at least one surface of a substrate;
   (2) applying an adherent layer of tonable photodielectric material over the pattern and surrounding substrate areas;
   (3) toning the photodielectric material with finely divided particles of adsorbent so that they become partially embedded within and protrude from the layer surface away from the substrate, the surfaces of the protruding part of the particles being adsorptive with respect to electroless plating catalysts or reductive precursors thereof.

4. A method for making a laminate for the preparation of multilayer printed circuits by electroless plating of conductive metal thereon which comprises the sequential steps of
   (1) imagewise exposing the toned surface of the photodielectric layer of the laminate of claim 1 to actinic radiation to effect a solubility change in the light-exposed areas of the photodielectric layer; and
   (2) removing the soluble image areas of the photodielectric layer by solvent development thereby uncovering areas of the underlying conductive pattern.

5. A laminate for the preparation of multilayer printed circuits made by the method of claim 4.

6. A method for making an electrolessly upper plated multilayer printed circuit which comprises the sequential steps of
   (1) applying an adherent layer of photodielectric material over the surface of the imaged toned photodielectric layer of the laminate of claim 5;
   (2) imagewise exposing the upper photodielectric layer to actinic radiation to effect a solubility change in the light-exposed areas of the upper photodielectric layer;
   (3) removing the soluble image areas of the photodielectric layer by solvent development thus uncovering areas of the underlying imaged photodielectric layer and conductive pattern;
   (4) rendering the uncovered adsorbent particles catalytic for electroless plating; and
   (5) electrolessly plating the uncovered catalyzed particles, conductive pattern areas and adjacent sidewalls.

7. The method of claim 6 wherein before applying the photodielectric layer, the sidewalls of the imaged photodielectric layer are toned with finely divided particles of adsorbent so that they become partially embedded within and protrude from the sidewalls, the surfaces of the protruding part of the particles being adsorptive with respect to electroless plating catalysts or reductive precursors thereof.

8. A method for making an electrolessly plated multilayer printed circuit which comprises the sequential steps of
   (1) rendering catalytic for electroless plating the protruding surfaces of the adsorbent particles of the laminate of claim 5;
   (2) electrolessly plating the catalyzed particles, conductive pattern areas and adjacent sidewalls;
   (3) optionally electroplating the electrolessly plated areas;
   (4) applying to the plated layer a solid layer of photoresist;
   (5) imagewise exposing the photoresist to actinic radiation to effect a solubility change in the light-exposed image areas of the photoresist;
   (6) removing the soluble image areas of the photoresist by solvent development thus exposing the underlying plated layer;
   (7) etching away the uncovered areas of the exposed electrolessly plated layer; and
   (8) stripping off the remaining areas of the photoresist.

9. The method of claim 8 wherein the sidewalls of the imaged photodielectric layer are toned with finely divided particles of adsorbent so that they become partially embedded within and protrude from the sidewalls, the surfaces of the protruding part of the particles being adsorptive with respect to electroless plating catalysts or reductive precursors thereof.

10. A method for making an electrolessly plated multilayer printed circuit which comprises the sequential steps of
(1) rendering catalytic for electroless plating the protruding surfaces of the adsorbent particles of the laminate of claim 5;
(2) electrolessly plating the uncovered catalyzed particles, conductive pattern areas and adjacent sidewalls;
(3) applying to the electrolessly plated layer a solid layer of photoresist;
(4) imagewise exposing the photoresist to actinic radiation to effect a solubility change in the light-exposed image areas of the photoresist;
(5) removing the soluble image areas of the photoresist by solvent development thus exposing the underlying electrolessly plated layer;
(6) plating the uncovered metal areas with the same or a different metal;
(7) stripping off the remaining resist image areas; and
(8) etching away the metal areas uncovered by stripping the resist.

11. The method of claim 10 wherein the sidewalls of the imaged photodielectric layer are toned with finely divided particles of adsorbent so that they become partially embedded within and protrude from the sidewalls, the surfaces of the protruding part of the particles being adsorptive with respect to electroless plating catalysts or reductive precursors thereof.

12. The method of any one of claims 3, 4 or 6-11 in which the protruding surfaces of the absorbent particles are rendered catalytic by adsorption thereon of a catalyst for the reduction of conductive metal ions, prior to electroless plating.

13. The method of any one of claims 3, 4 or 6-11 in which the protruding surfaces of the adsorbent particles are rendered reductive by adsorption thereon of a reducing agent for the reduction of conductive metal ions, prior to catalyst formation.

14. A laminate for the preparation of a multilayer printed circuit by electroless plating of conductive metal thereon which comprises
(1) a substrate having formed on a surface thereof
(2) a conductive pattern, and,
(3) overlying the pattern and surrounding substrate areas, a layer of tonable photodielectric material having partially embedded therein finely divided particles of adsorbent which protrude from the layer surface away from the substrate, the protrusive surfaces of which have been rendered catalytic by adsorption thereon of an electroless plating catalyst.

15. The laminate of claim 5 wherein the protrusive surfaces have been rendered catalytic by adsorption thereon of an electroless plating catalyst.

16. The laminate of claim 5 having a photodielectric layer overlying the imaged photodielectric layer toned with finely divided particles of adsorbent.

17. The laminate of claim 1 in which the substrate contains a plurality of through holes.

18. The laminate of claim 1 in which the substrate has two major surfaces both of which have a conductive pattern (2), and overlying the pattern and surrounding substrate areas a layer of tonable photodielectric material (3) having partially embedded therein finely divided particles of adsorbent which protrude from the layer surface away from the substrate, the protrusive surfaces of which are adsorptive with respect to electroless plating catalystst or reductive precursors thereof.

19. A method for making a multilayer printed circuit by repeating one or more times on the same substrate the methods of any one of claims 6, 8, or 10.

* * * * *